United States Patent [19]

Ichinose et al.

[11] Patent Number: 5,688,366
[45] Date of Patent: Nov. 18, 1997

[54] ETCHING METHOD, METHOD OF PRODUCING A SEMICONDUCTOR DEVICE, AND ETCHANT THEREFOR

[75] Inventors: Hirofumi Ichinose; Satoshi Shinkura, both of Tsuzuki-gun; Akio Hasebe, Souraku-gun; Tsutomu Murakami, Nara, all of Japan

[73] Assignee: Canon Kabushiki Kaisha, Tokyo, Japan

[21] Appl. No.: 429,039

[22] Filed: Apr. 26, 1995

[30] Foreign Application Priority Data

Apr. 28, 1994 [JP] Japan .................. 6-092756

[51] Int. Cl.$^6$ .................. C23F 1/10; H01L 21/306
[52] U.S. Cl. .................. 156/662.1; 156/625.1; 136/244; 136/256; 252/79.1; 252/79.4
[58] Field of Search .................. 156/662.1, 625.1; 252/79.1, 79.4; 136/244, 256

[56] References Cited

U.S. PATENT DOCUMENTS

| | | | |
|---|---|---|---|
| 3,262,852 | 7/1966 | Fuller | 252/79.4 |
| 3,664,913 | 5/1972 | Ratcliff | 216/28 |
| 4,383,857 | 5/1983 | Steeves et al. | 252/79.4 |
| 4,419,530 | 12/1983 | Nath | 136/251 |
| 4,652,513 | 3/1987 | Pentak et al. | 430/278.1 |
| 4,802,950 | 2/1989 | Croll | 216/52 |
| 4,920,366 | 4/1990 | Bowen et al. | 350/96.2 |
| 4,997,529 | 3/1991 | Totsuka et al. | 204/224 |
| 5,354,490 | 10/1994 | Yu et al. | 252/79.1 |

FOREIGN PATENT DOCUMENTS

| | | | |
|---|---|---|---|
| 124978 | 10/1978 | Japan | 156/625.1 |
| 55-108779 | 8/1980 | Japan. | |

OTHER PUBLICATIONS

J53-124978, Oct. 31, 1978, Sato et al, English Translation.

*Primary Examiner*—Janet C. Baxter
*Attorney, Agent, or Firm*—Fitzpatrick, Cella, Harper & Scinto

[57] ABSTRACT

A method of etching material as a transparent conductive film, a method of producing a semiconductor device, and an etchant therefor are disclosed. These method and etchant are simple, excellent in etching selectivity, and stable for a long time. The methods include the steps of disposing paste on material wherein the paste includes an etching solution and at least one kind of fine particles. A method of producing a semiconductor device, including the above-described etching steps is also disclosed.

22 Claims, 4 Drawing Sheets

ETCHING METHOD, METHOD OF PRODUCING A SEMICONDUCTOR DEVICE, AND ETCHANT THEREFOR

BACKGROUND OF THE INVENTION

1. Field of the Invention

The present invention relates to an etching method, a method of producing a semiconductor device, and an etchant therefor. More specifically, the present invention relates to a method of etching, that is simple, has excellent etching selectivity, and does little or no damage to the non-etching region. The method of producing a semiconductor device employs the above-described etching technique to produce a semiconductor device having excellent characteristics. The invention also provides an etchant suitable for etching a transparent conductive film and producing a semiconductor device.

2. Description of the Related Art

Techniques for etching are commonly used in production of a variety of semiconductor devices, and in particular photovoltaic semiconductor devices such as solar cells and photodiodes.

For example, a semiconductor device such as a diode, IC or the like, employs films or layers to be patterned or isolated, such as a metal conductive film, a transparent conductive film, a base material, a semiconductor layer or the like.

In addition, a semiconductor device such as a photodiode or solar cell including a monolithic solar cell employs films or layers to be patterned or isolated, such as a metal conductive film, a transparent conductive film, a semiconductor layer or the like.

For example, amorphous silicon solar cells have a transparent conductive film disposed on a transparent substrate or on an amorphous silicon layer, and this transparent conductive film is patterned or isolated using an etching technique.

A particular example of a process relating to the etching of a transparent conducting film is as follows:

A transparent conductive film is deposited on a transparent semiinsulating substrate and etched into a desired pattern required for a solar cell. An amorphous silicon layer responsible for photoelectric conversion is deposited on the patterned transparent conductive film, and a back electrode is further formed on it. Thus a complete amorphous silicon solar cell is obtained.

Another example of a process for fabricating an amorphous silicon solar cell is as follows. An amorphous silicon layer is deposited on a metal substrate, and a transparent conductive layer is further deposited on it. The transparent conductive layer is then etched into a desired pattern and a grid electrode used to collect a current is formed on it wherein for example silver is employed as a material for the grid electrode.

One technique for selectively etching a transparent conductive film on a substrate into a desired pattern is to employ chemical etching such as that disclosed in Japanese Patent Laid-Open No. 55-108779 (1980) or U.S. Pat. No. 4,419,530.

An example of a conventional chemical etching technique for patterning a transparent conductive film will be described in more detail below.

A photoresist film is coated on a transparent conductive film by means of a silk screen or flexographic printing method or a spin coating technique. The photoresist film is exposed to light and developed to form a desired positive pattern in the photoresist film. The portions of the transparent conductive film exposed through the negative portions of the resist pattern (that is, window areas through which the transparent conductive film is exposed) are etched off in an etchant such as ferric chloride or nitric acid so that the portions of the transparent conductive film covered with the resist remain without being etched and thus a pattern corresponding to the resist pattern is formed in the transparent conductive film. Alternatively, the negative portions of the resist pattern are subjected to dry etching such as plasma etching so as to form a pattern in the transparent conductive film corresponding to the resist pattern. Then, the resist remaining (in a hardened state) on the positive pattern portions is dissolved and/or stripped off using a resist stripping agent or removed by means of a dry process such as a plasma ashing process. Thus, a desired pattern is formed in the transparent conductive film.

However, these conventional etching techniques for patterning or isolating require not only an etching process but also a large number of pre- and post-processes such as formation of a positive pattern in a resist such as a photoresist, exposure, development, etching, resist removing, etc.

Furthermore, resists often swell or peel during a chemical etching process in an etching solution, which causes degradation in etching accuracy. Besides, temperature of an etching solution has to be controlled very precisely.

When dry etching is employed, high accuracy patterning is possible. However, dry etching is a slow process, and the throughput of equipment is low. As a result, dry etching is a costly process.

Another problem is that a very strong oxidant is required to remove a photoresist. Handling of strong oxidants is dangerous, and their waste disposal is difficult. If plasma ashing is employed, it is possible to remove a resist without using a liquid solution, and plasma ashing is a pollution-free process. Unfortunately, the plasma ashing cannot be employed for all types of resists.

Furthermore, troubles often occur in an etching process of patterning a transparent conductive film, and thus defects occur in the resultant pattern. These defects cause short circuits or shunt circuits in solar cells. As a result, the photoelectric conversion efficiency decreases, the characteristics are dispersed, and the production yield decreases.

SUMMARY OF THE INVENTION

In view of the above, it is an object of the present invention to provide a method of etching a material including a film to be etched, that is simple, excellent in etching selectivity and completely or substantially free of damage on non-etching area, and also a method of producing a semiconductor device, that includes the above etching process.

Furthermore, the present invention provides a highly reliable method of etching a material including a film to be etched, that can be performed effectively at a low cost without producing etching defects, and also a method of producing a semiconductor device.

The present invention also provides a method of producing a semiconductor device, that includes a high-yield etching process capable of etching a material including a film to be etched into a pattern with a beautiful appearance without producing etching defects that would result in short circuits or shunt circuits.

The present invention also provides an etching solution that maintains stable etching capability for long-term preservation.

Thus, according to an aspect of the present invention, there is provided a method of etching a material to be etched, comprising the step of disposing paste on a material, the paste including at least one type of fine particles and an etching solution.

According to another aspect of the present invention, there is provided a method of producing a semiconductor device having a material to be etched, including the step of disposing paste on a material, the paste including at least one type of fine particles and an etching solution thereby patterning the material to be etched.

According to still another aspect of the present invention, there is provided an etchant including an etching solution and at least one kind of fine particles.

DESCRIPTION OF THE PREFERRED EMBODIMENTS

Figure 1:
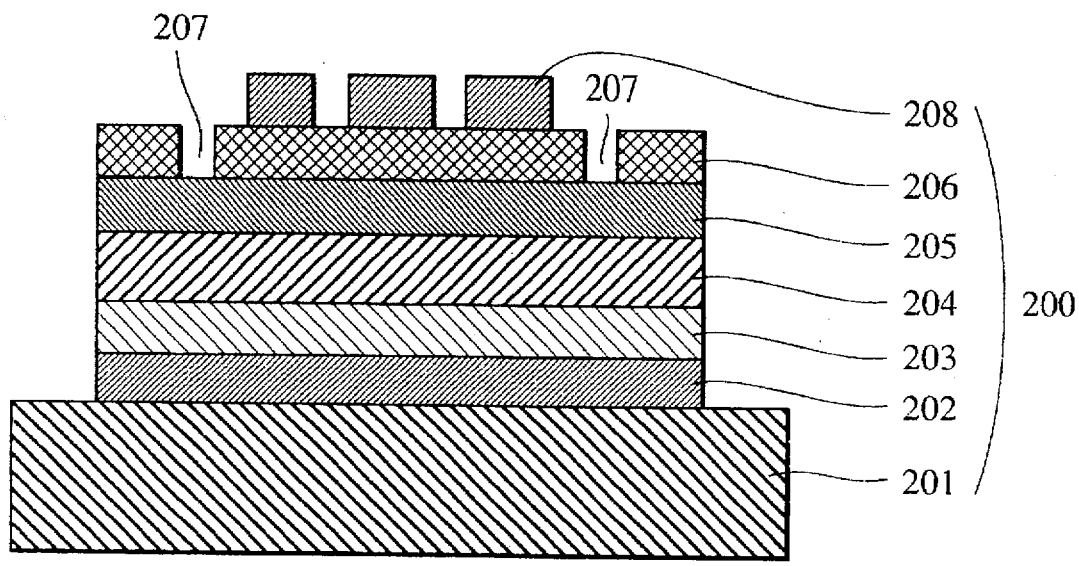
FIG. 1 is a schematic diagram illustrating an example of a layer structure of a solar cell.

In the present invention, a transparent conductive film is etched using an etchant including an etching solution and at least one kind of fine particles wherein the etching solution and the particles are mixed together in a paste form.

The present invention is based on the experimentally-acquired knowledge on optimum mixing conditions of the fine particles and the etching solution, as well as optimum heat treatment conditions.

ETCHING

According to the present invention, a material including a film to be etched can be etched into an excellent pattern as explained below.

In chemical etching, an acid or alkali solution is generally used as an etching solution. The etching solution reacts with atoms of the surface region of a material including film to be etched, and the resultant reaction products are dissolved and removed.

For example, a transparent conductive film as a film to be etched of an amorphous solar cell is formed of a material having good transparency to visible light and good electrical conductivity, such as $SnO_2$, $In_2O_3$, ITO ($In_2O_3+SnO_2$), etc. A transparent conductive film of this type can be deposited by means of vacuum evaporation, ion evaporation, sputtering, CVD, plasma CVD, or spraying.

To etch the transparent conductive film, it is made to come into contact with an acid or alkali etching solution such as concentrated sulfuric acid, concentrated hydrochloric acid, or iron chloride, and heated so that the etching solution reacts with the transparent conductive film thereby dissolving it. In practice, a substrate having a transparent conductive film formed on it is dipped in an etching solution and heated. However, as described above, the surface of the transparent conductive film has to be masked with a resist pattern so that the portion of the transparent conductive film to be left without being etched is isolated from the etching solution, wherein a photosensitive material such as a photoresist is used as the resist and a pattern is formed in the resist via complicated processes.

In the conventional technique, an etching process and a resist pattern formation process are performed separately in such a manner that an etching solution comes in contact with a transparent conductive film after a resist pattern has been formed on the transparent conductive film. In contrast, in the present invention, patterning and etching are performed at the same time by disposing an etchant on a transparent conductive film wherein the etchant is composed of an etching solution and fine particles mixed together in a paste form. Therefore, in this technique according to the present invention, no mask is required in the patterning process. As a result, pre-processes for forming a positive pattern such as resist coating, exposure, and development, and post-processes such as resist removing are not required, and the process is drastically simplified. In this technique, furthermore, the rate of reaction between an etching solution and a transparent conductive film can be increased by raising the heat treatment temperature to 100° C. or higher thereby shortening the etching time. If the processing is performed at a temperature lower than 60° C., the reaction between an etching solution and a transparent conductive film is not enough to obtain a good pattern having a uniform line width, which sometimes causes disconnection in lines. In the present invention, since the substrate is not dipped in an etching solution, even a transparent conductive film having a multi-layer structure can be etched without problems relating to the influence of the etching solution on the lower layers of the transparent conductive film.

In the present invention, the fine particles are mixed with the etching solution so as to increase the viscosity. Unlike liquid solution, the etching paste having high viscosity shows no deformation during a patterning process if the processing time is shortened enough. Fine resin particles as fine polymer particles can be used for this purpose, and preferable resins include acrylic resin such as poly methyl methacrylate, silicone resin, benzoguanamine resin, fluorocarbon resin such as tetrafluoroethylene resin or polyvinyl fluoride resin, urethane resin, polystyrene, etc. The use of these macromolecular resins also results in an improvement in resistance to solvents and acids and thus results in an improvement in resistance to etching chemicals thereby providing stable paste.

In the case where the processing is performed at a high temperature greater than 100° C. to increase the etching rate, macromolecular resins having a melting point higher than the heat treatment temperature are preferably employed so that no change in the composition or state occurs during the processing. If a macromolecular resin material that is selected properly considering the above factors is used, undesirable change in the state of the macromolecular resin particles does not occur during heat treatment in which the etching solution contained in the paste reacts with a film to be etched. This means that the paste does not become so strongly stuck to a substrate that the paste cannot be removed. Regarding the shape of the macromolecular resin particles, a spherical shape is preferable, whereas other various shapes may also be employed. As for the structure, a mixture of various types of macromolecular resins or a multi-layer structure having layers made of different macromolecular resins may also be employed. Furthermore, a composite material including a different type of material may also be employed.

Preferably, macromolecular resin particles and an etching solution are mixed uniformly into a paste form in such a manner that the etching solution is distributed uniformly in the paste so that the etching solution can come into uniform contact with a film to be etched such as a transparent conductive film and thus uniform reaction can occur thereby achieving a uniform pattern. It is preferable that the diameter of the macromolecular resin particles be as small as possible so that the particles are distributed uniformly. More particularly, it is preferable that the average particle diameter be less than 20 µm, more preferably in the range from 0.1 µm to 20 µm, and most preferably in the range from 0.2 µm to 10 µm. In the case where the etching paste is coated using a printing technique, it is preferable that the macromolecular resin particles have proper softness, and it is also preferable that glycerin serving as a lubricant be added to the paste so as to improve printability. The conditions, such as the average diameter of particles, the amount of glycerin, the amount of agents to control the viscosity for example a viscosity enhancing agent or water for reducing the viscosity, and the amount of a diluent for controlling the etch rate, are selected properly depending on the line width of patterns to be formed and the desired etching accuracy.

A pattern of paste can be formed on a film to be etched such as a transparent conductive film using known techniques. One technique is screen printing. The viscosity of the paste can preferably be adjusted to suit the screen printing, and it is possible to form a desired pattern through a screen. Coating and dotting thickness can also be employed. These are simple techniques to form a pattern. Alternatively, paste can be supplied onto a film to be etched such as a transparent conductive film using a dispenser. The thickness of the paste is selected properly depending on the thickness of a film to be etched such as a transparent conductive film to be etched, whereas, in general, the range from 10 µm to 2 mm is preferable. In many cases, if the thickness of the paste is greater than 10 µm, the etching solution contained in the paste can react enough with a film to be etched such as a transparent conductive film to form a good pattern having no residue. On the other hand, for many cases, the thickness of the paste should be less than 2 mm so as to avoid deformation of the paste in a lateral direction thereby obtaining a good pattern having uniform line widths.

After the paste has been coated on the film to be etched such as the transparent conductive film, the paste is heated up to a proper temperature in a hot air oven or an infrared oven. To enhance the etching rate, a higher temperature is more effective. More particularly, it is preferable that the paste be heated to a temperature higher than 100° C. The heating of the paste to a temperate higher 100° C. is preferable also because leakage of the etching solution can be avoided and therefore better patterning can be achieved. After the completion of the heat treatment, the paste is washed away using water or a solvent. Furthermore, if macromolecular particles having a melting point higher than the heat treatment temperature are used, the particles are thermally stable during the heat treatment. Therefore, the particles do not react with each other and they are not melted. As a result, the particles never adhere to a substrate, and thus they can be easily removed.

Using the etching method according to the present invention, a semiconductor device can be fabricated as described below. In the following description, a photovoltaic semiconductor device 200 will be taken as an example of a semiconductor device, and a typical process will be described referring to FIG. 1. As shown in FIG. 1, the photovoltaic semiconductor device to be fabricated has a structure including a substrate 201, a lower electrode 202, semiconductor layers 203, 204, 205, a transparent conductive film 206 serving as an upper electrode, and a grid electrode 208, wherein portions 207 etched off from the transparent conductive film are also shown in FIG. 1.

This structure is formed as follows: A lower electrode 202 is first deposited on a substrate 201, and layers 203, 204, 205 are then formed successively on the lower electrode 202 using a non-single semiconductor material such as an amorphous, polycrystalline, or microcrystalline semiconductor. Semiconductor materials containing silicon atoms are preferable as the material for the semiconductor layers 203, 204, 205. More specifically, the semiconductor layers are preferably formed of an amorphous silicon-based semiconductor. In general, the non-single semiconductor layers 203, 204, 205 include n-type (p-type), i-type, and p-type (n-type) layers. The semiconductor layer 204 may be divided into sublayers, such as three layers including top and bottom layers made of a non-single silicon semiconductor and a middle layer made of a non-single silicon germanium.

Figure 2:
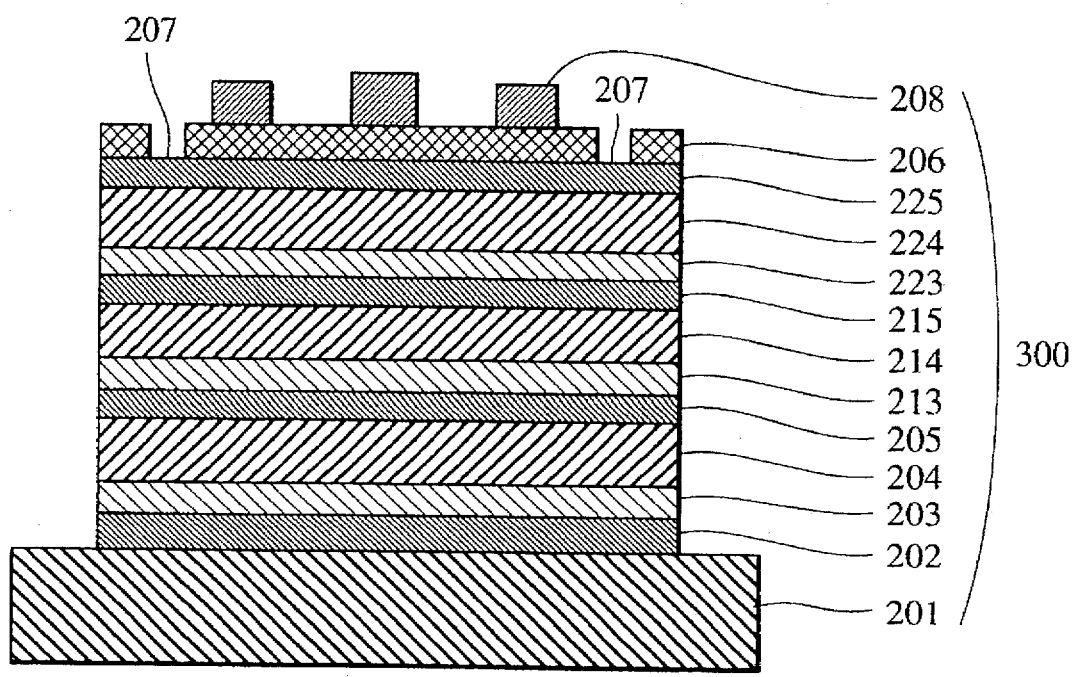
FIG. 2 is a schematic diagram illustrating another example of a layer structure of a solar cell.

In addition to the single cell structure having only one set of nip (or pin) structure such as that shown in FIG. 1, the photovoltaic semiconductor device may also include two or three, or even more, sets of cell structures wherein the structure having two sets of pin structures is called a tandem cell structure, and that having three sets of pin structures is called a triple cell structure (shown in FIG. 2).

In the case of the semiconductor device shown in FIG. 1, a transparent conductive film 206 is then deposited on the semiconductor layer 205, and patterned into a desired pattern so that it acts as an upper electrode. If required, a grid electrode is further formed on the transparent conductive film 206.

To extract greater power from a solar cell, the solar cell must have a greater area. However, in general, the conversion efficiency decreases as the area increases. This is mainly because the power loss due to the resistance of the transparent conductive film 206 increases with the increasing area. The optimum effective area of a solar cell is determined taking into account also the current collection efficiency of the grid electrode 208. If the patterning of the transparent conductive film 206 can be performed more precisely, then it becomes possible to employ a greater effective area thereby extracting greater output power from a solar cell. On the other hand, if the line pattern 207 is not formed accurately, a shunt leakage current occurs in this portion located outside the effective area, and the conversion efficiency decreases owing to the leakage current. Therefore, unnecessary portions of the transparent conductive film should be etched off entirely.

Figure 3:
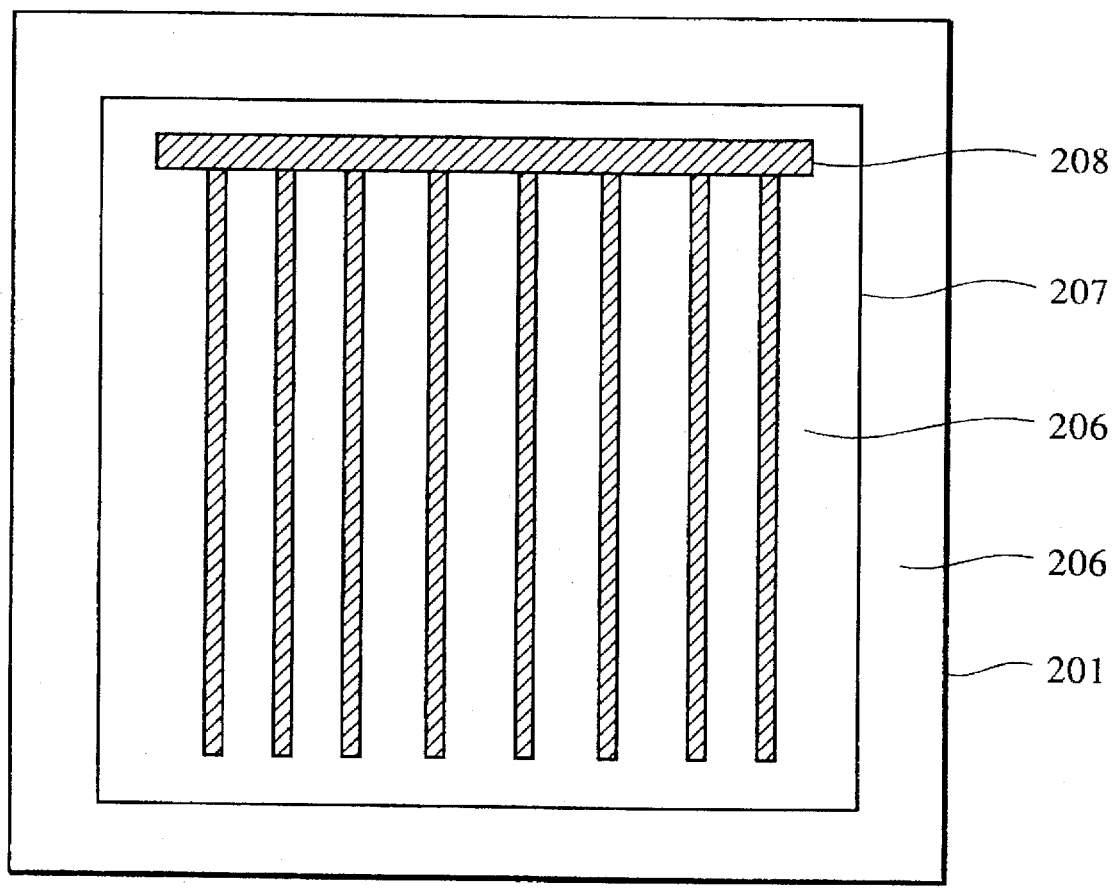
FIG. 3 is a plan view illustrating an example of the upper surface structure of a solar cell.

Another example of the structure of a solar cell (photovoltaic semiconductor device), that can be preferably fabricated according to the present invention, will be described below referring to FIGS. 2 and 3.

In the example described above referring to FIG. 1, the solar cell has a single cell structure made of an amorphous silicon-based semiconductor material wherein light is incident on the surface opposite to the substrate. In contrast, the solar cell shown in FIG. 2 has a triple cell structure made of an amorphous silicon-based semiconductor material. FIG. 3 is a view of the solar cell shown in FIGS. 1 or 2 seen from the light incidence side. In the example shown in FIG. 3, the peripheries of the substrate 201, the lower electrode 202 formed on the substrate, the semiconductor layers 203, 204, 205 (or 203, 204, 205, 213, 214, 215, 223, 224, 225), and the transparent conductive film 206 are all coincident with each other.

The present invention, as a matter of course, can also be applied to a solar cell comprising amorphous silicon-based semiconductor layers deposited on a transparent insulating substrate.

SUBSTRATE

The substrate 201 serves as an element for mechanically supporting thin film layers such as amorphous silicon semiconductor layers 203, 204, 205 of a solar cell. In some cases, the substrate 201 also acts as an electrode. Either electrically conductive or insulating material can be employed as the material for the substrate 201, as long as it is capable of withstanding high temperature processing for depositing semiconductor layers 203, 204, and 205. Electrically conductive materials include metals such as Fe, Ni, Cr, Al, Mo, Au, Nb, Ta, V, Ti, Pt, Pb, Ti, alloys of these metals such as brass, sheet materials such as a stainless steel sheet, composite materials of these, a carbon sheet, a galvanized steel sheet, etc. Insulating materials include: heat-resisting synthetic resins in the form of a sheet or a film such as polyester, polyethylene, polycarbonate, cellulose acetate, polypropylene, polyvinyl chloride, polyvinylidene chloride, polystyrene, polyamide, polyimide, or epoxy resin; composite materials consisting of any of these resins and glass fiber, carbon fiber, boron fiber, or metal fiber; thin sheets of the above metals or resin materials coated with a thin film of different metal and/or dielectric film such as $SiO_2$, $Si_3N_4$, $Al_2O_3$, AlN wherein the coating is performed by means of sputtering, evaporation, plating; glass; ceramics; and multi-layer structure materials including any combination of the above materials.

LOWER ELECTRODE

The lower electrode 202 acts as an electrode through which power generated by the semiconductor layers 203, 204, and 205 are extracted to the outside. The lower electrode 202 has to be made of a material having a work function that results in an ohmic contact with the semiconductor layer 203. Preferable materials for the lower electrode include: metal elements or alloys such as Al, Ag, Pt, Au, Ni, Ti, Mo, W, Fe, V, Cr, Cu, stainless steel, brass, nichrome; and transparent conductive oxides (TCO) such as $SnO_2$, $In_2O_3$, ZnO, ITO. It is preferable that the lower electrode 202 have a flat surface. However, if it is desirable that irregular light reflection occur at the surface, the surface may be textured so that the surface has proper irregularities. When the substrate 201 is made of an electrically conductive material and thus the substrate 201 can have ohmic contact with the semiconductor 203, the lower electrode 202 is not necessarily required.

The lower electrode can be formed by means of plating, evaporation, or sputtering.

SEMICONDUCTOR LAYERS

The semiconductor layers, as described above, can be formed of non-single crystal materials such as amorphous materials, polycrystalline materials, microcrystalline materials, or a mixture of these materials.

As described above, amorphous silicon-based semiconductors are preferable materials for the non-single crystal semiconductor layers. In particular, as for a material of the i-type semiconductor layer 204, amorphous semiconductors of Group IV elements or Group IV element-based alloys, such as a-Si:H, a-Si:F, a-Si:H:F, a-SiGe:H, a-SiGe:F, a-SiGe:H:F, a-SiC:H, a-SiC:F, a-SiC:H:F, are preferable.

These materials can also be employed to form the p-type and n-type semiconductor layers 203 and 205 disposed on either side of the i-type semiconductor layer 204 wherein in this case proper impurities are doped in the semiconductor layer so as to obtain a desired conduction type. More particularly, Group III elements in the periodic table can preferably be employed as the doping impurities for the p-type semiconductor wherein compounds containing such elements can be used as source materials. Preferable Group III elements include B, Al, Ga, and In. Of these elements, B is the most preferable. As for the doping impurities to obtain n-type semiconductors, Group V elements in the periodic table can preferably be employed and compounds containing such elements can be used as source materials. Preferable Group V elements include P, N, As, and Sb whereas P and As are more preferable.

The amorphous silicon semiconductor layers can be formed using known techniques such as evaporation, sputtering, RF plasma CVD, microwave plasma CVD, VHF plasma CVD, ECR, thermal CVD, LPCVD, photochemical CVD, etc. In practical production in industries, the RF plasma CVD technique is commonly used in which a source gas is decomposed by an RF plasma thereby depositing a semiconductor layer on a substrate. In the RF plasma CVD, however, decomposition efficiency of a source gas is as low as 10%, and the deposition rate is rather slow such as in the range from 1 Å/sec to 10 Å/sec. In the plasma CVD and VHF plasma CVD, better decomposition efficiencies and higher deposition rates can be obtained. Various known reaction apparatus such as a batch type deposition apparatus or continuous deposition apparatus can be employed for depositing semiconductor layers. These apparatus can also be used to form a multi-layer structure including two or more semiconductor junctions such as a tandem or triple cell structure which is often employed to improve spectral sensitivity and also to increase the output voltage of solar cells.

UPPER ELECTRODE

The materials for the lower electrode can also be employed to form an upper electrode. Either a transparent or opaque material may be used depending on whether the solar cell is illuminated with light through the upper electrode or the substrate.

The upper electrode may be formed using known techniques such as resistance-heating evaporation, electron beam evaporation, sputtering, spraying, etc., whereas a technique should be properly selected from these and the deposition temperature should be properly determined so that the semiconductor layers and the lower electrode that have been already formed are not damaged during the deposition process of the upper electrode.

Figure 7:
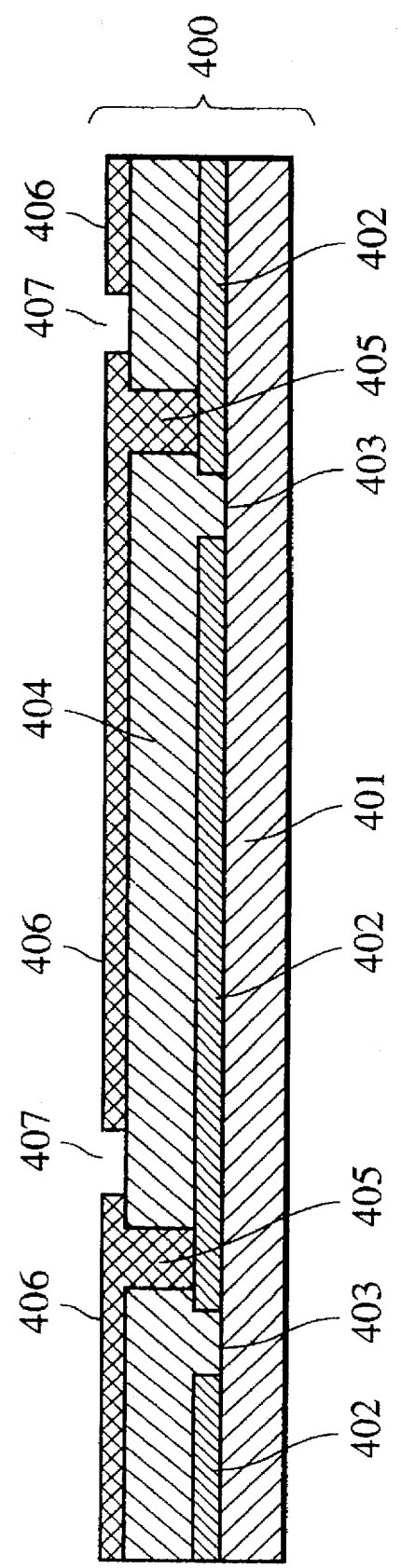
FIG. 7 is a cross-sectional view illustrating an example of a layer structure of a monolithic solar cell.

FIG. 7 is a cross-sectional view illustrating an example of a layer structure of another semiconductor device in the form of a solar cell (photovoltaic semiconductor device).

As shown in FIG. 7, the photovoltaic semiconductor device 400 to be fabricated has a structure including a substrate 401, a first electrode 402, a semiconductor 404, a second electrode 406. First grooves 403 etched off from the first electrode layer, second grooves 405 etched off from the semiconductor layer and third grooves 407 etched off from the second electrode layer are also shown in FIG. 7.

This structure is formed as follows: A first electrode layer is formed first by deposition on the substrate 401, and the first electrode is patterned by etching, then the first grooves 403 and the first electrode 402 are formed. The semiconductor layer is formed by deposition on the first electrode 402 and the substrate 401, and is isolated by the second groove 405 formed in the semiconductor layer by etching so that the semiconductor 404 is formed. Subsequently, the second electrode layer is formed by deposition on the semiconductor and the first electrode, and is isolated by the third groove 407 formed in the second electrode layer by etching, so that the second electrode 406 is formed.

The grooves as described above are formed by being etched off from the electrode layer or semiconductor layer, using an etching paste of the present invention.

The solar cell illustrated in FIG. 7 is obtained through the above-described process.

The solar cells thus formed are arranged side-by-side and plural semiconductors are connected in series thereto.

EXAMPLES

Examples of etching processes using the paste comprising an etching solution and macromolecular particles according to the present invention will be described in detail below referring to some figures.

Example 1

Referring to FIGS. 1 and 2, an example of a patterning process will be described.

First, an $SnO_2$ film 102 having a thickness of 450 nm was formed on a glass substrate 101 having a size of 11 cm×11 cm by means of spraying at 450° C.

Figure 4:
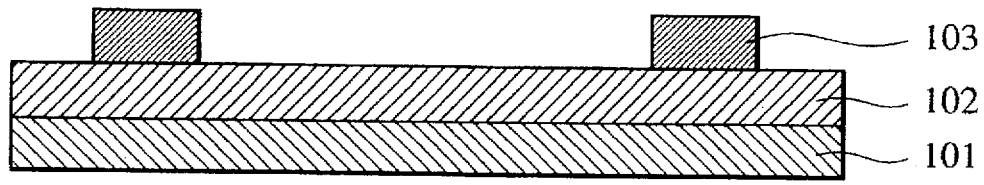
FIG. 4 is a cross-sectional view illustrating an example of an etching process.
Figure 5:
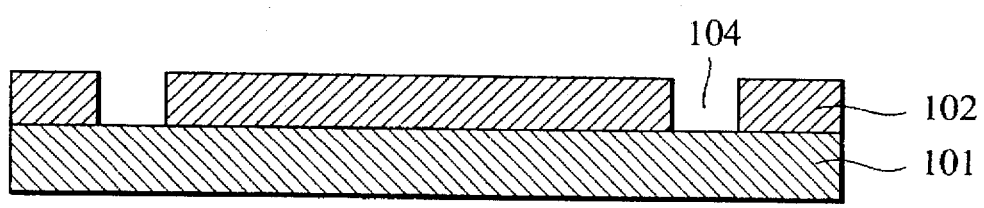
FIG. 5 is a cross-sectional view illustrating an example of an etching process.
Figure 6:
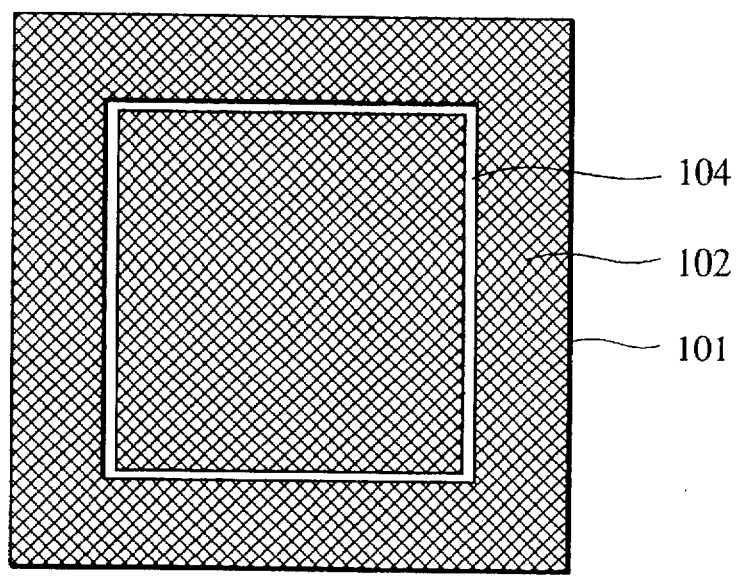
FIG. 6 is a plan view of the device to be processed shown in FIG. 5.

Then, etching paste was prepared as follows. 57 g of ferric chloride including crystal water (hexahydrate) was heated in a hot water bath up to 80° C. thereby obtaining a melted etching solution. Then 40 g of acryl resin particles (acryls beads) having a diameter of 5 μm and 18 g of glycerin were mixed into the melted ferric chloride thereby obtaining etching paste. A pattern of the etching paste 103 having 1 mm lines in a 10 cm×10 cm area was formed on the $SnO_2$ film 102 using a screen printing technique as shown in FIG. 4, and baked at 170° C. for 5 min in an infrared oven (not shown). The substrate was then taken out of the oven and cooled. The substrate was then cleaned with purified water so that the etching paste was removed. The substrate was dried for 3 min in the oven kept at 80° C. Thus, a pattern 104 was obtained in an area of 10 cm×10 cm (FIG. 5). A total of one hundred substrates was fabricated in the same manner and evaluated regarding the etching quality.

The average width of the line patterns formed in the above transparent conductive films on the substrates was 1.0 mm±0.1 mm, which was satisfactorily uniform.

Example 2

In this example, a transparent conductive film was patterned as the same manner as in example 1 except that silicone resin particles having a diameter of 10 μm (silicone beads having a melting point of 300° C.) were employed as macromolecular particles and mixed with an etching solution into a paste form as described below.

| Ferric Chloride (Hexahydrate): | 58.5 g |
|---|---|
| Silicone Beads: | 40.0 g |
| Glycerin: | 18.0 g |

The etched line patterns were observed and their width was measured. No significant ununiformity in the etched patterns was observed and the average line width was 1.0 mm±0.1 mm.

Example 3

In this example, a transparent conductive film was also patterned as the same manner as in example 1 except that a 1:1 mixture of silicone resin particles having a diameter of 5 μm (melting point: 300° C.) and acryl resin particles having a diameter of 8 μm (melting point: 250° C.) was employed as macromolecular particles. The etched line patterns were observed and their width was measured. Also in this example, no significant ununiformity in the etched patterns was observed and the average line width was 1.0 mm±0.1 mm.

Example 4

An ITO film having a thickness of 500 nm was deposited at 450° C. on a glass substrate similar to that used in example 1 by means of sputtering. The ITO films was then patterned in the same manner as in example 1. The etched line patterns were observed and their width was measured. Again in this example, no significant ununiformity in the etched patterns was observed and the average line width was 1.0 mm±0.1 mm.

Example 5

In this example, the patterning was performed at four different temperatures 60° C., 100° C., 200° C., and 300° C. in a similar manner to example 1 wherein fifty substrates were prepared for each temperature. The etched line patterns were observed and their width was measured. The results are shown in Table 1.

As can be seen from Table 1, the patterning accuracy varies with the etching temperature even when the same etching paste is used. In particular, if the etching is performed at a rather low temperature, the line width is dispersed. This problem can be avoided by selecting a proper etching time. For example, when the etching is performed at 100° C., etching time of 10 min results in a uniform pattern width such as 1.0 mm±0.1 mm. Thus, if the etching is performed while heating a substrate at a proper temperature, it is possible to obtain a high-precision pattern having no etching defects by a short-time process.

TABLE 1

| Heat Treatment Temperature (°C.) | Visual Inspection | Line Width |
|---|---|---|
| 60 | Poor Ununiformity | 0.3–1.0 mm |
| 100 | Some Substrates Show Poor Uniformity | 0.5–1.0 mm |
| 200 | Excellent Uniformity | 1.0 mm ± 0.1 mm |
| 300 | Residue of Paste Was Observed on Some Substrates After Cleaning | 1.0–2.0 mm |

Another important conclusion obtained from the above results is that the heat treatment temperature should be lower than the melting point of the macromolecular particles so that all paste can be washed away from a substrate after the etching and thus more beautiful and more reliable patterning can be achieved.

Example 6

In this example, the patterning was performed using macromolecular particles having different diameters 0.01 μm, 0.1 μm, 20 μm, and 30 μm in a similar manner to example 1 wherein fifty substrates were prepared for each diameter. The etched line patterns were observed and their width was measured. The results are shown in Table 2.

TABLE 2

| Particle Diameter (μm) | Visual Inspection | Line Width |
| --- | --- | --- |
| 0.01 | Poor Ununiformity | 0.4–1.0 mm |
| 0.1 | Some Substrates Show Poor Uniformity | 0.5–1.0 mm |
| 5 | Excellent Uniformity | 1.0 mm ± 0.1 mm |
| 20 | Excellent Uniformity | 1.0 mm ± 0.15 mm |
| 30 | Poor Ununiformity | 1.0–2.0 mm |

As can be seen from Table 2, the patterning accuracy also varies with the diameter of macromolecular particles even when the same etching solution and the same additive, that is glycerin in this case, are used. For the patterns having a line width of 1.0 mm, the macromolecular particles having a diameter in the range from 0.1 μm to 20 μm are preferable to obtain good paste in which an etching solution and particles are uniformly mixed in such a manner that the particles confine the etching solution within the paste without leakage which makes it possible to perform excellent patterning, whereas macromolecular particles having a diameter of the order of 0.01 μm or 30 μm may also be employed depending on the pattern width to be obtained and also depending on the screen used.

Comparative Example 1

For the sake of comparison, transparent conductive films were also patterned in a similar manner to example 1 except that the macromolecular particles were replaced with protein particles having a diameter of 10 μm, and the resultant patterns were evaluated. Residual etching paste was observed on the substrates after cleaning the substrates. The line width was dispersed in the range from 0.1 mm to 2.0 mm.

Example 7

An amorphous solar cell 200 (FIG. 1) having a single pin structure was fabricated using processes including the patterning process according to the present invention, as described below.

First, a SUS460BA substrate 201 was degreased and cleaned enough and placed in DC sputtering equipment (not shown). 4000 Å thick Ag was deposited on the substrate, and a ZnO film having a thickness of 4000 Å was then deposited on it thereby forming a lower electrode 202. The substrate was taken out of the DC sputtering equipment, and placed in a RF plasma CVD equipment (not shown), in which an n-type semiconductor layer 203, an i-type semiconductor layer 204, and a p-type semiconductor layer 205 were deposited successively in this order. The substrate was then taken out of the RF plasma CVD equipment, and placed in resistance-heating evaporation equipment (not shown), in which an ITO film was deposited at 450° C. thereby forming a 700 Å thick transparent conductive film 206 which also serves as an antireflection film. The substrate was then taken out of the evaporation equipment.

Then etching paste was prepared in a similar manner to example 1, and coated on the ITO film using a screen printing apparatus (not shown) so as to form a pattern having 1 mm wide lines in a 10 cm×10 cm area. The substrate was then baked in an infrared oven (not shown) at 170° C. for 5 min. The substrate was then taken out of the oven and cooled. The substrate was then cleaned with purified water so that the etching paste was removed. Thus, a pattern 207 was formed in an area of 10 cm×10 cm of the ITO film. The substrate was dried for 3 min in the oven kept at 80° C. A grid electrode 208 serving as a current collection electrode was then formed of a silver-filled paste using a screen printing technique.

A hundred amorphous solar cells were fabricated in the above-described manner and their initial characteristics were measured as follows.

First, voltage-current characteristics were measured in the dark and shunt resistance was determined from the slope near the origin of the plot of the measured voltage-current characteristics. The slopes showed that the average shunt resistance was 120.3 k$\Omega$cm$^2$.

Then, the solar cells were illuminated with light of optical power of 100 mWcm$^2$ emitted by a light source (from SPIRE Co.,) that simulates a global solar spectrum of the AM1.5 condition, and the photoelectrical conversion efficiencies were measured. The average value of the measured conversion efficiencies was 7.5%.

Furthermore, the etching quality was evaluated in a similar manner to example 1. No residual portions were observed in the areas to be etched of the transparent conductive films 206 made of ITO. The etching was performed uniformly and thus the width of the resultant patterns was uniform.

The solar cells fabricated using the etching technique according to the present invention showed excellent characteristics without short-circuit or shunt-circuit defects. No disconnection was observed in the line patterns.

Example 8

In this example, polystyrene particles having a diameter of 8 μm were employed as the macromolecular particles. Except for that, transparent conductive films were patterned in the same manner as in example 7 thereby fabricating a hundred amorphous solar cells. The initial characteristics were measured in the same manner as in the example 7. The average value of shunt resistance was 115.5 k$\Omega$cm$^2$, and the average value of conversion efficiencies was 7.5%.

The etching quality was also evaluated by means of visual inspection. No defect or etching residue remaining in the transparent conductive film was observed. The etching uniformity was excellent and the obtained patterns had uniform line widths.

In this example, the fabricated solar cells also showed excellent characteristics without unwanted short circuits, shunt circuits, and disconnections.

Example 9

In this example, amorphous solar cells having a triple cell structure were fabricated wherein the semiconductor layers were formed using a microwave CVD technique. Except for that, basically the same process as in example 7 was employed. First, a lower electrode 202 consisting of Ag and ZnO layers was formed on a SUS substrate 201. The substrate was then placed in microwave plasma CVD equipment (not shown) and an n-type layer 203, an i-type layer 204, and p-type layer 205 were deposited successively in this order thereby forming a bottom pin-structure. Similarly, an n-type layer 213, an i-type layer 214, and p-type layer 215 were deposited successively in this order thereby forming a middle pin-structure. Furthermore, an n-type layer 223, an i-type layer 224, and p-type layer 225 were deposited successively in this order thereby forming a top pin-structure. Thus, the formation of semiconductor layers was complete. An ITO film was then deposited thereby forming a transparent conductive film 206 which also serves as an antireflection film. The transparent conductive film 206 was patterned using a similar etching technique used in example 7. In this way, a hundred amorphous solar cells were fabricated. The initial characteristics were measured in the same manner as in the example 7. The average value of shunt resistance was 123.0 k$\Omega$cm$^2$, and the average value of conversion efficiencies was 10.4%. The etching quality was also evaluated by means of visual inspection. No defect or etching residue remaining in the transparent conductive film was observed. The etching uniformity was excellent and the obtained patterns had uniform line widths.

In this example, the fabricated solar cells also showed excellent characteristics without unwanted short circuits, shunt circuits, and disconnections.

Example 10

In this example solar cells having a single cell structure were fabricated in a similar manner to example 7 except that the etching was performed at various temperatures 60° C., 100° C., 200° C., and 300° C. wherein fifty solar cells were fabricated at each temperature. The fabricated solar cells were evaluated in the same manner as in example 7. The results are shown in Table 3.

TABLE 3

| Heat Treatment Temperature (°C.) | Shunt Resistance (k$\Omega$cm$^2$) | Conversion Efficiency (%) | Visual Inspection |
| --- | --- | --- | --- |
| 60 | 10.6 | 5.4 | not uniform some patterns were very narrow |
| 100 | 18.0 | 6.5 | not uniform in some areas |
| 200 | 121.5 | 7.5 | excellent |
| 300 | 100.1 | 7.0 | residue of paste was observed in some areas |

As can be seen from Table 3, the characteristics of complete solar cells vary with the heat treatment temperature even when the solar cell is fabricated using the same etching paste. In particular, the etching at a rather low temperature results in a reduction in the shunt resistance and the conversion efficiency. However, if the etching time is selected properly, the above problem can be avoided and good shunt resistance and conversion efficiency can be obtained.

If the etching is performed at a higher temperature, the etching can be performed for a shorter time. However, it is preferable that the etching is performed at a temperature lower than the melting point of the macromolecular particles so that all paste can be washed away from a substrate leaving no residue.

Comparatable Example 2

For the sake of comparison, solar cells were also fabricated in such a manner described below. The same process as in example 7 was performed until a transparent conductive film was formed. Then, a photosensitive resist material was coated on the transparent conductive film, and dried. With the intention of forming the same pattern as that in example 7, a mask was put on the photosensitive resist, and the photosensitive resist was exposed to ultraviolet light through the mask. The mask was removed, and the photosensitive resist was developed thereby forming a pattern in the resist.

The solar cell substrate having the resist in which the pattern was formed was dipped in an iron chloride solution for 30 min so as to etch the transparent conductive film. The substrate was then cleaned with purified water. The resist was then removed using alcohol. The substrate was cleaned again in purified water and then dried.

Furthermore, a current collection electrode was formed on the transparent conductive film as in the example 7, and thus complete solar cells having a single cell structure were obtained. The initial characteristics of the fabricated solar cells were measured in a similar manner to example 7. 10% of the fabricated solar cells showed a shunt resistance as low as 10 k$\Omega$cm$^2$. The conversion efficiency was 5.3%±1.8% and showed a large variation. The pattern of the solar cells that showed low shunt resistance were observed via a microscope. Residual portions were observed in the areas that should have be etched off.

This is because, in the resist process, the resist pattern was not formed perfectly and resist residue remained in some portions that should have been removed. Some of the solar cells having a low photoelectric conversion efficiency showed a high series resistance. This is because the separation of the resist from the semiconductor layer occurred during the etching process.

Example 11

The long-term stability of the etching process was evaluated. The process similar to that used in example 1 was automated and printing was performed every 10 sec until the printing had been performed 10,000 times. Then, the patterning was performed in the same manner as in example 1. The pattern that was formed on a substrate by the ten thousandth printing operation was evaluated. The pattern was as good as that in example 1.

Example 12

For the sake of further evaluating the long-term stability of the etching process, the etching paste was stocked for 60 days, and then the patterning was performed and the resultant patterns were evaluated in the same manner as in example 1. The results were as good as in example 1.

As described above, the present invention provides a method of etching a transparent conductive film, that is simple and excellent in etching selectivity. The present invention also provides a method of producing a semiconductor device, that includes the above etching process.

The present invention also provides a highly reliable method of etching a transparent conductive film, that can be performed effectively at a low cost without producing etching defects, and also a method of producing a semiconductor device.

The present invention also provides a method of producing a semiconductor device, that includes a high-yield etching process capable of etching a transparent conductive film into a beautiful-appearance pattern without producing etching defects that would result in short circuits or shunt circuits.

The present invention also provides an etching solution that maintains stable etching capability for long-term preservation.

While the present invention has been described above referring to specific embodiments and examples, it should be understood that various changes, substitutions and modifications can be made without departing from the spirit and scope of the invention.

Furthermore, in addition to photovoltaic semiconductor devices such as the solar cells described above, the present invention can also be applied to other various types of devices having a transparent conductive film, including photosensors such as a phototransistor, a photodiode, a CCD, and a liquid crystal device having a transparent conductive film deposited on a substrate.

Example 13

As amorphous solar cell 400 (shown in FIG. 7) having a single pin structure was fabricated using processes including the patterning process according to the present invention, as described below.

First, a stainless steel substrate 401 with SiC layer deposited thereon by DC sputtering as insulator was prepared. The substrate was then placed in DC sputtering equipment (not shown), and aluminum film was deposited on the SiC layer thereby forming a first electrode by using an etching paste.

The etching paste was prepared in a similar manner as in example 1 except that etchant mixed solution of phosphoric acid, nitric acid and acetic acid were employed, the etching paste was applied to the first electrode layer using a screen printing machine (not shown) so as to form a fine isolation pattern.

Then baking (heating treatment), washing and drying were conducted in the same way as example 7.

Then a semiconductor layer comprising n-type layer, i-type layer and p-type layer successively was deposited on the first electrode and substrate in the same way as example 7 with RF plasma CVD equipment.

An etching paste, having a mixture solution formed of hydrofluoric acid, nitric acid and acetic acid, was printed on the semiconductor layer by screen printing machine (not shown) so as to form a fine isolation pattern (groove 405).

Then an ITO film was deposited on the semiconductor and the first electrode so as to form a second electrode, after formation of the semiconductor.

Then etching paste was prepared in similar manner to example 1, and applied onto the ITO film using a screen printing apparatus (not shown). Patterning was conducted employing the above etching paste, thereby forming grooves 407.

One hundred pieces of solar cells (series connected monolithic type) were fabricated in above-described manner and their initial characteristics were measured in the same manner as that in the example 7.

The average value of shunt resistance was 121.5 k$\Omega$cm$^2$, and the average value of conversion efficiency was 7.8%.

The etching quality was also evaluated by means of visual inspection. No residual portions were observed in the areas to be etched. The etching uniformity was excellent and the obtained pattern had uniform line width.

The solar cells fabricated using the etching technique according to the present invention showed excellent characteristics without short-circuit or shunt-circuit defects. No disconnection was observed in the line pattern.

What is claimed is:

1. An etching method comprising the steps of:
   a) disposing an etching paste on a transparent conductive film material in a pattern, said etching paste comprising at least one kind of fine particles and an etching solution, wherein said fine particles comprise resin particles selected from the group consisting of acryl resin, silicone resin, benzoguanamine resin, fluorocarbon resin, urethane resin, and polystyrene resin and b) performing heat treatment on said paste disposed on said material.

2. An etching method according to claim 1, wherein the melting point of said fine particles is higher than the temperature at which said heat treatment is performed.

3. An etching method according to claim 1, wherein said heat treatment is performed at a temperature higher than 100° C.

4. An etching method according to claim 1, wherein the average diameter of said fine particles is less than 20 μm.

5. An etching method according to claim 1, wherein said paste is disposed on the material by a technique selected from the group consisting of a printing technique, a coating technique, and a dotting technique.

6. An etching method according to claim 1, wherein said material comprises a metal.

7. An etching method according to claim 1, wherein said paste is disposed on the material in such a manner that the thickness of said paste is in the range from 10 μm to 2 mm.

8. An etching method according to claim 1, wherein said paste further includes glycerin.

9. An etching method according to claim 1, wherein said paste is removed after said step of performing heat treatment.

10. A method of producing a semiconductor device, comprising the step of:
   disposing an etching paste on a transparent conductive film material in a pattern, said etching paste comprising at least one kind of fine particles and an etching solution, wherein said fine particles comprise resin particles selected from the group consisting of acryl resin, silicone resin, benzoguanamine resin, fluorocarbon resin, urethane resin, and polystyrene resin and b) performing heat treatment on said paste disposed on said material.

11. A method of producing a semiconductor device according to claim 10, wherein the melting point of said fine particles is higher than the temperature at which said heat treatment is performed.

12. A method of producing a semiconductor device according to claim 10, wherein said heat treatment is performed at a temperature higher than 100° C.

13. A method of producing a semiconductor device according to claim 10, wherein the average diameter of said fine particles is less than 20 μm.

14. A method of producing a semiconductor device according to claim 10, wherein said paste is disposed on the transparent conductive film by a technique selected from the group consisting of a printing technique, a coating technique, and a dotting technique.

15. A method of producing a semiconductor device according to claim 10, wherein said semiconductor device includes a non-single semiconductor layer.

16. A method of producing a semiconductor device according to claim 15, wherein said non-single semiconductor layer includes an amorphous semiconductor material containing silicon atoms.

17. A method of producing a semiconductor device according to claim 10, wherein said semiconductor device is a device selected from the group consisting of a photovoltaic device, a photosensor, and a liquid crystal device.

18. A method of producing a semiconductor device according to claim 10, wherein said material comprises a metal.

19. A method of producing a semiconductor device according to claim 10, wherein said paste is disposed on the material in such a manner that the thickness of said paste is in the range from 10 μm to 2 mm.

20. A method of producing a semiconductor device according to claim 10, wherein said paste further includes glycerin.

21. A method of producing a semiconductor device according to claim 10, wherein said semiconductor device includes a p-type semiconductor layer, an i-type semiconductor layer, and an n-type semiconductor layer, said layers being arranged in the above-described order.

22. A method of producing a semiconductor device according to claim 10, wherein said method further comprises removing said paste after said step of performing heat treatment.

* * * * *

UNITED STATES PATENT AND TRADEMARK OFFICE
CERTIFICATE OF CORRECTION

PATENT NO. : 5,688,366
DATED : November 18, 1997
INVENTOR(S): HIROFUMI ICHINOSE ET AL.

Page 1 of 3

It is certified that error appears in the above-identified patent and that said Letters Patent is hereby corrected as shown below:

ON TITLE PAGE AT [57] ABSTRACT

Line 3 of paragraph, "method" should read --methods--.

COLUMN 2

Line 27, "temperature" should read --the temperature--;
Line 38, "the" should be deleted;
Line 51, "on" should read --on the--.

COLUMN 4

Line 47, "providing" should read --providing a--.

COLUMN 5

Line 21, "etch" should read --etching--;
Line 29, "thickness" should read --techniques--;
Line 50, "higher" should read --higher than--.

UNITED STATES PATENT AND TRADEMARK OFFICE
CERTIFICATE OF CORRECTION

PATENT NO. : 5,688,366

DATED : November 18, 1997

INVENTOR(S): HIROFUMI ICHINOSE ET AL.

It is certified that error appears in the above-identified patent and that said Letters Patent is hereby corrected as shown below:

COLUMN 9

Line 64, "as" should read --in--.

COLUMN 10

Line 12, "films" should read --film--.

COLUMN 13

Line 53, "Comparatable" should read --Comparative--.

COLUMN 14

Line 15, "be" should read --been--;
Line 55, "beautiful-appearance pattern" should read --pattern of beautiful appearance--.

COLUMN 15

Line 8, "As" should read --An--;
Line 19, after "that" insert --an--;
Line 20, "were" should read --was--;

UNITED STATES PATENT AND TRADEMARK OFFICE
CERTIFICATE OF CORRECTION

PATENT NO. : 5,688,366

DATED : November 18, 1997

INVENTOR(S): HIROFUMI ICHINOSE ET AL.          Page 3 of 3

It is certified that error appears in the above-identified patent and that said Letters Patent is hereby corrected as shown below:

COLUMN 16

Line 3, "b)" should read --¶ b)--;
Line 30, "step" should read --steps--;
Line 31, "disposing" should read --a) disposing--;
Line 38, "b)" should read --¶ b)--.

Signed and Sealed this

Second Day of June, 1998

Attest:

BRUCE LEHMAN

Attesting Officer          Commissioner of Patents and Trademarks